(12) United States Patent
Wu et al.

(10) Patent No.: US 8,072,489 B2
(45) Date of Patent: Dec. 6, 2011

(54) DIGITAL CAMERA MODULE USING STACKED CHIP PACKAGE

(75) Inventors: Ying-Cheng Wu, Miao-li (TW); Ying-Tang Su, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 1433 days.

(21) Appl. No.: 11/592,912

(22) Filed: Nov. 3, 2006

(65) Prior Publication Data

US 2007/0165136 A1  Jul. 19, 2007

(30) Foreign Application Priority Data

Jan. 14, 2006 (CN) .......................... 2006 1 0032946

(51) Int. Cl.
*A61B 1/04* (2006.01)
*H04N 5/225* (2006.01)
(52) U.S. Cl. ......................................... 348/76; 348/373
(58) Field of Classification Search ................... 348/76, 348/373
See application file for complete search history.

(56) References Cited

U.S. PATENT DOCUMENTS

| 2001/0033338 A1* | 10/2001 | Hunter ........................... 348/335 |
| 2003/0001960 A9* | 1/2003 | Kato et al. ..................... 348/342 |
| 2003/0234886 A1* | 12/2003 | Cho et al. ...................... 348/340 |
| 2005/0285239 A1* | 12/2005 | Tsai et al. ...................... 257/676 |

FOREIGN PATENT DOCUMENTS

| CN | 2459631 Y | 11/2001 |
| CN | 1372322 A | 10/2002 |
| CN | 2599758 Y | 1/2004 |

* cited by examiner

*Primary Examiner* — George Neurauter
(74) *Attorney, Agent, or Firm* — Altis Law Group, Inc.

(57) ABSTRACT

A chip package (101) and a lens module (103) mounted on the chip package are provided. The chip package includes a substrate (20), a first chip (40), a second chip (70), and a cover (80). The first chip is mounted on the substrate and is electrically connected with the substrate via a first plurality of wires (50a). The second chip is mounted above the first chip and above the wires connected with the first chip and is electrically connected with the substrate via a second plurality of wires (50b). The cover is mounted above the second chip and the wires connected with the second chip.

16 Claims, 7 Drawing Sheets

DIGITAL CAMERA MODULE USING STACKED CHIP PACKAGE

CROSS-REFERENCE TO RELATED APPLICATIONS

This application is related to a co-pending U.S. patent application Ser. No. 11/592,848, entitled "STACKED CHIP PACKAGING STRUCTURE", by Ying-Cheng Wu et al. Such application has the same assignee as the present application and has been concurrently filed herewith. The above-identified application is incorporated herein by reference.

TECHNICAL FIELD

The present invention generally relates to digital camera modules and, more particularly, to a digital camera module using a stacked chip package.

BACKGROUND

Generally, digital cameras are image-recording media capable of photographing a plurality of still images without using film. Such a digital camera typically uses an image pickup device, which is a kind of semiconductor device, such as a charge coupled device (CCD) or complementary metal oxide semiconductor (CMOS). In the digital camera, an object image formed on the image pickup device through a lens is converted into an electrical signal, e.g., by the image pickup device, and the electrical signal is stored as a digital signal in a mobile phone or personal digital assistant (PDA), in which the digital camera is mounted, or in a "stand-alone" digital still or video camera unit. In order to protect the image pickup device from contamination or pollution (i.e., from dust or water vapor), the image pickup device is generally sealed in a structural package.

Typical chip packages, however, only allow packaging of one single chip in each package. In the case where a digital camera module having multiple functions is necessary, a peripheral chip, such as a flash memory chip or a digital signal processor (DSP) chip, must be packaged in a single chip package in accordance with the conventional chip packaging method. Two such chip packages occupy more area in the mobile phone, PDA, or stand-alone camera unit, which accordingly is prone to adversely affect miniaturization thereof.

One way of solving the foresaid question is to fabricate more than one chip in a single package. FIG. 7 (related art) shows a typical stacked chip package 90, which includes two chips packaged in a single package structure. The package 90 includes a substrate 91, a first chip 93, a second chip 95, a cover 97 and a plurality of wires 98. The substrate 91 includes a board portion 910, a sidewall portion 912, and a receiving cavity 914 formed between the board portion 910 and the sidewall portion 912. Multiple conductive leads 915 are arranged on an upper surface of the board portion 910 and are exposed to the receiving cavity 914. The conductive leads 915 further extend to a bottom surface of the board portion 90, in order to electrically connect the package 90 to external circuitry. The first chip 93 is mounted on the upper surface of the board portion 910 and is received in the receiving cavity 914. The second chip 95 is directly mounted on the top of the first chip 93. Both of the first and second chips 93, 95 provide a plurality of conductive points on the upper surfaces thereof. Each wire 98 electrically connects a conductive point of the chips 93, 95 to a corresponding conductive lead 915 of the substrate 91. The cover 97 is fixed to the top of the sidewall 912 of the substrate 91 to enclose the receiving cavity 914.

However, the second chip 95 must be smaller in size than the first chip 93 to allow the conductive points of the first chip 93 to connect to the wires 98. As a result, the package 90 is unsuitable for an apparatus where an image sensor chip (the second chip), needs to be mounted on the top of a peripheral chip (the first chip) and has a size larger than the size of the peripheral chip.

In addition, the wires 98, which electrically connect the conductive points of the first chip 93 to the leads 915, may be damaged through contact with the second chip 95.

Therefore, an improved digital camera module using stacked chip package is desired in order to overcome the above-described shortcomings.

SUMMARY

In one aspect, a digital camera module using a stacked chip package is provided. The digital camera module includes a chip package and a lens module mounted on the chip package to form an image on the chip package. The chip package includes a substrate, a first chip, a second chip, and a cover. The first chip is mounted on the substrate and is electrically connected with the substrate via a first plurality of wires. The second chip is mounted above the first chip and the wires connected with the first chip. The second chip is electrically connected with the substrate via a second plurality of wires. The cover is mounted above the second chip and the wires connected with the second chip.

Other advantages and novel features will become more apparent from the following detailed description when taken in conjunction with the accompanying drawings.

BRIEF DESCRIPTION OF THE DRAWINGS

Many aspects of the present digital camera module using stacked chip package can be better understood with reference to the following drawings. The components in the drawings are not necessarily drawn to scale, the emphasis instead being placed upon clearly illustrating the principles of the digital camera using stacked chip package. Moreover, in the drawings, like reference numerals designate corresponding parts throughout the several views.

DETAILED DESCRIPTION OF THE PREFERRED EMBODIMENTS

Figure 1:
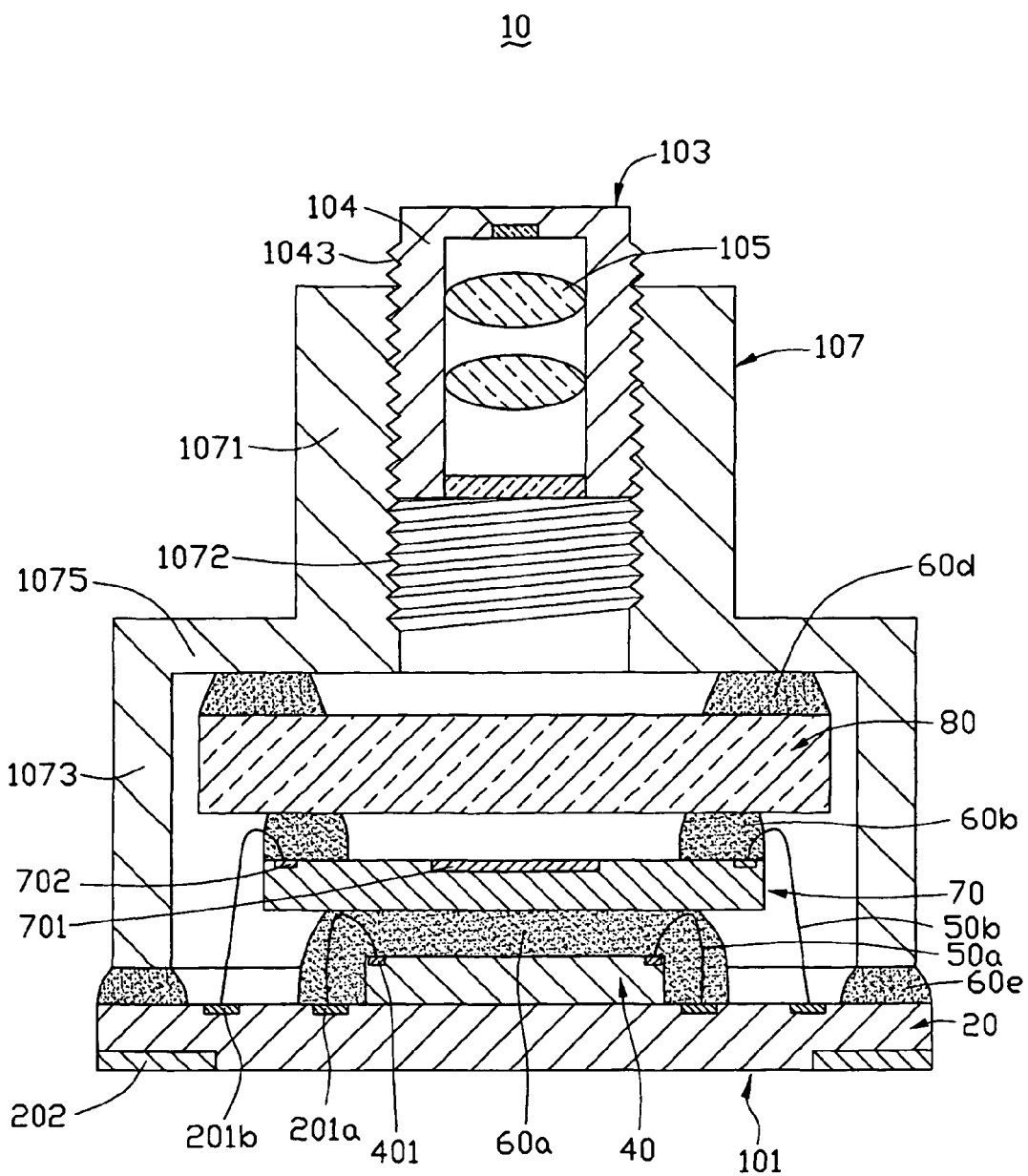
FIG. 1 is a schematic, cross-sectional view of a digital camera module, using a stacked chip package, according to a first preferred embodiment.

As illustrated in FIG. 1, a digital camera module 10 using a stacked chip package 101, according to a first preferred embodiment, includes a stacked chip package 101, a lens module 103, and a holder 107, wherein the chip package 101 and the lens module 103 are respectively mounted proximate two opposite ends of the holder 107.

The chip package 101 includes a substrate 20; a first chip 40; a first and second plurality of wires 50a, 50b; an adhesive/glue 60a, 60b, 60d, 60e, a second chip 70; and a cover 80.

The substrate 20 can be, e.g., a ceramic substrate, printed circuit board, flame retardant type 4 (FR4), or the like. In the first preferred embodiment, the substrate 20 has a single-layer structure. The substrate 20 has a plurality of first top contacts 201a and a plurality of second top contacts 201b directly on an upper surface thereof and further has a plurality of bottom contacts 202 directly on a bottom surface, the bottom surface being positioned opposite to the upper surface. The first and second top contacts 201a, 201b are arranged around/proximate a circumference/perimeter of the upper surface. In particular, the second top contacts 201b are disposed directly on a peripheral portion of the upper surface, and the first top contacts 201a are disposed inside the second top contacts 201b, directly on the upper surface. Each bottom contact 202 is electrically attached/linked to a corresponding top contact 201a, 201b via a corresponding connecting device, such as conductive through hole, conductive lead, or the like. The bottom contacts 202 are arranged in such a pattern that they match with and electrically connect/link to external circuitry.

The first chip 40 can, for example, be a peripheral chip chosen form the group consisting of flash memory chips, drive chips, digital signal processor (DSP) chips, and the like. The first chip 40 is mounted on the substrate 20, surrounded by the first and second top contacts 201a, 201b. A plurality of first pads 401 is arranged on an upper surface of the first chip 40. Each first pad 401 is electrically connected/joined to a corresponding first top contact 201a via a corresponding wire 50a.

The adhesive/glue 60a is applied to an outer periphery (i.e., adjacent the side surfaces thereof) and the upper surface of the first chip 40. The adhesive/glue 60a is configured to ensure a spacing between the first chip 40 and the second chip 70 is maintained and, in particular, to hold the second chip 70 above each wire loop formed by the wires 50a (i.e., the adhesive/glue 60a functions as both an adherent and a spacer). In order to protect the wires 50a from the second chip 70 and/or damage by external force, the adhesive/glue 60 can be further applied to cover the wires 50a. The adhesive/glue 60a can be somewhat viscous and flowing when initially applied and must be able to be hardened, e.g., by self-curing, heating or application of ultraviolet light.

The second chip 70 can be, for example, an image sensor chip and is adhered/attached on top of the first chip 40 via the adhesive/glue 60a. The second chip 70 has an active area 701 (e.g., a photo-registering zone) and a plurality of second pads 702 arranged around the active area 701, on an upper surface thereof. Each second pad 702 is electrically connected/linked to a corresponding second contact 201b of the substrate 20, via a corresponding wire 50b.

The adhesive/glue 60b is applied, advantageously, to a periphery of the upper surface of the second chip 70 around the active area 701, the adhesive/glue 60b and the cover 80 combining to fully seal the active area 701 from potential environmental harm. The adhesive/glue 60b is configured to hold the cover 80 above each wire loop formed by the wires 50b. In order to protect the wires 50b from damage due to external force, the adhesive/glue 60b can be further applied to the wires 60b in a manner so as to cover the whole of each wire 60b.

The cover 80 is stacked above the second chip 70 and is adhered/attached to the adhesive/glue 60b, thereby permanently mounting the cover 80 relative to the second chip 70. The cover 80 and the adhesive/glue 60b cooperatively close the active area 701 of the second chip 70, thereby protecting the active area 701 from pollution/contamination and/or other external environmental effects (e.g., temperature extremes, humidity, etc.). The cover 80 is advantageously transparent, thus permitting light to pass therethrough to the active area 701 of the second chip 70. The adhesive 60d is applied to a periphery of an upper surface of the cover 80.

The adhesive 60e, in turn, is applied to a periphery of the upper surface of the substrate 20.

The lens module 103 includes a barrel 104 and at least one lens 105. The barrel 104 is a hollow cylinder for receiving the at least one lens 105 therein and has an external thread 1043 formed on an external surface thereof.

The lens holder 107 includes a cylinder portion 1071 configured (i.e., structured and arranged) for receiving the lens module 103, a seat portion 1073 from which the cylinder portion 1071 projects, and a through hole defined by the respective interiors of the cylinder portion 1071 and the seat portion 1073 and penetrating therethrough. The cylinder portion 1071 has a diameter smaller than that of the seat portion 1073, thereby forming a step surface 1075 therebetween. The cylinder portion 1071 further includes an internal thread 1072 formed therein.

The seat portion 1073 of the holder 107 receives the chip package 101 therein, wherein an inner surface of the step surface 1075 is adhered to the periphery of the cover 80 via the adhesive/glue 60d, and an end of the seat portion 1073, opposite to the step surface 1075, is adhered to the upper surface of the substrate 20 via the adhesive/glue 60e. The cylinder portion 1071 receives the lens module 103 therein, with the external thread 1043 of the barrel 104 engaging with the internal thread 1072 of the cylinder portion. The at least one lens 105 faces toward the active area 701 of the second chip 70 to form an image thereon.

Figure 2:
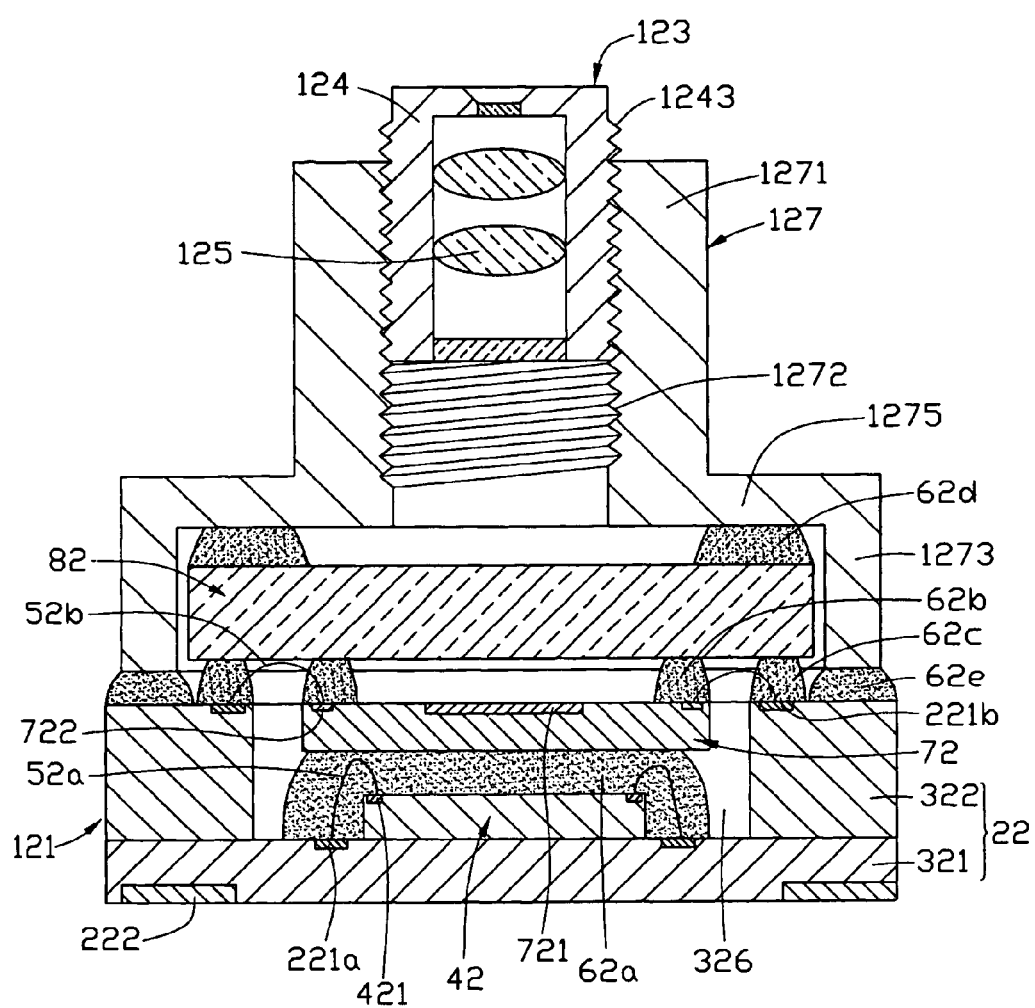
FIG. 2 is a schematic, cross-sectional view of a digital camera module, using a stacked chip package, according to a second preferred embodiment.

FIG. 2 shows a digital camera module 12, according to a second preferred embodiment. The digital camera module 12 is similar to the digital camera module 10 and is constructed to include a stacked chip package 121; a lens module 123; and a holder 127. The stacked chip package 121 includes a substrate 22; a first chip 42; a first and second plurality of wires 52a, 52b; adhesive/glues 62a, 62b, 62d, 62e; a second chip 72; and a cover 82. The substrate 22 includes a plurality of first and second top contacts 221a, 221b, and a plurality of bottom contacts 222. The first chip 42 includes a plurality of first pads 421. The second chip 72 includes an active area 721 and a plurality of second pads 722. The lens module 123 includes a barrel 124 and at least one lens 125. The barrel 124 has an external thread 1243. The lens holder 127 includes a cylinder portion 1271 and a seat portion 1273. The cylinder portion 1271 includes an internal thread 1272 and a step surface 1275. It is primarily in the structure of the chip package 121 and the mounting of the lens holder 127 that the digital camera module 12 is different from the digital camera module 10.

The substrate 22 of the chip package 121 has a two-layered structure, that is to say, the substrate 22 includes a board portion 321 and a frame portion 322 disposed on the board portion 321. The board portion 321 and frame portion 322 cooperatively define a receiving cavity 326 therebetween. The first top contacts 221a are disposed on an upper surface of the board portion 321, and are contained in the receiving cavity 326. The second top contacts 221b are arranged on an upper surface of the frame portion 311.

The first chip 42 is mounted on the board portion 321, surrounded by the first top pads 221a, and received in the receiving cavity 326. The first chip pads 421 are electrically connected/linked with the first top contacts 221a via the wires 52a.

The second chip 72 is fixed on top of the first chip 42 via the adhesive/glue 62a, which is applied to both the top and periphery of the first chip 42 and holds/spaces the second chip 72 above each wire loop formed by the wires 52a. Each second pad 722 is electrically connected with a corresponding second top pad 221b, via a corresponding wire 52b.

The cover 82 is fixed on top of second chip 72 via the adhesive/glue 62b, which is applied to the upper periphery of the second chip 72 and has a height extending above each wire loop formed by the wires 52b, thus ensuring the needed spacing between the second chip 72 and the cover 82. Moreover, the cover 82 is further adhered/attached to the frame portion 322 via an adhesive/glue 62c, which is applied to the top of the frame portion 322, and holds the cover 82 above each wire loop by the wires 52b. In order to protect the wires 52b from damage due to external forces, one of the adhesive/glue 62b and 62c can be further applied to the wires 52b to cover the whole of each wire 52b.

The seat portion 1273 of the holder 127 is mounted to the chip package 121. The seat portion 1273 receives the cover 82 therein, and an inner surface of the step surface 1275 is adhered/mounted to the periphery of the cover 82 via the adhesive/glue 62d. Further, an end of the seat portion 1273, opposite to the step surface 1275, is adhered to the upper surface of the frame portion 322 of the substrate 22 via the adhesive/glue 62e.

Figure 3:
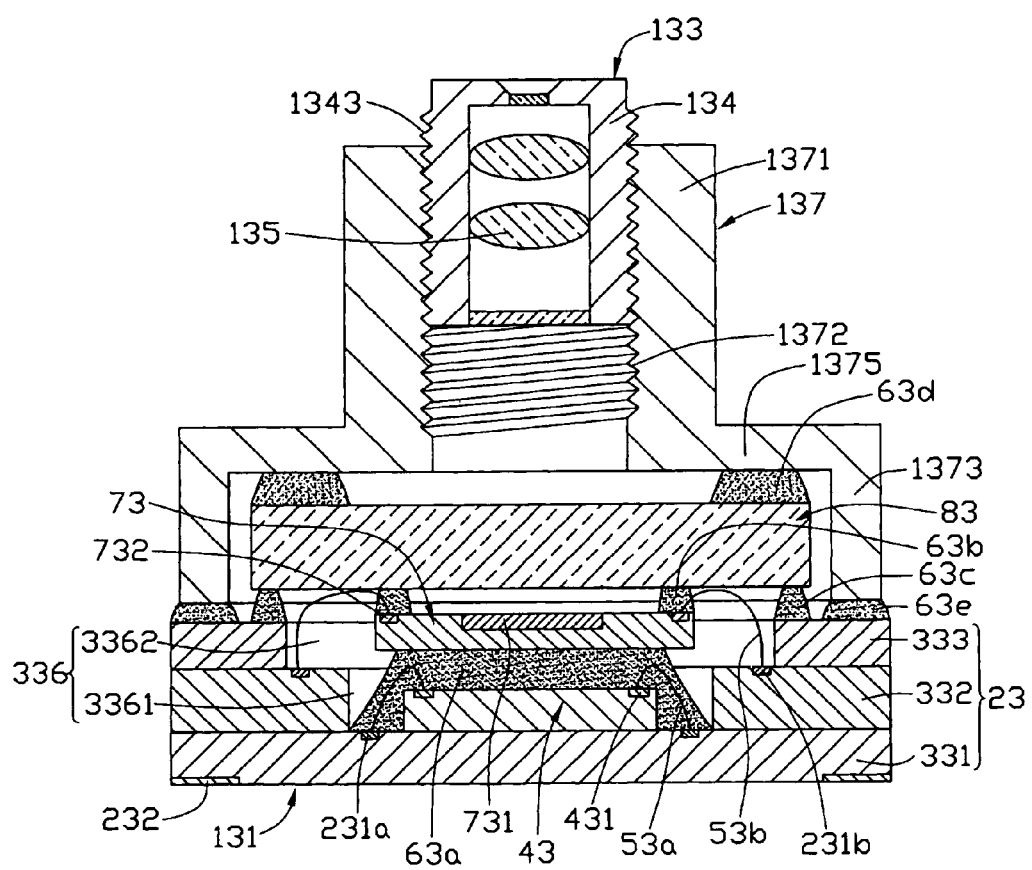
FIG. 3 is a schematic, cross-sectional view of a digital camera module, using a stacked chip package, according to a third preferred embodiment.

FIG. 3 shows a digital camera module 13, according to a third preferred embodiment. The digital camera module 13 is similar to the digital camera module 10 and is constructed to include a chip package 131; a lens module 133; and a holder 137. The stacked chip package 121 includes a substrate 23; a first chip 43; a first and second plurality of wires 53a, 53b; adhesive/glue 63a, 63b, 63d, 63e; a second chip 73; and a cover 83. The substrate 23 includes a plurality of first and second top contacts 231a, 231b, and a plurality of bottom contacts 232. The first chip 43 includes a plurality of first pads 431. The second chip 73 includes an active area 731 and a plurality of second pads 732. The lens module 133 includes a barrel 134 and at least one lens 135. The barrel 134 has an external thread 1343. The lens holder 137 includes a cylinder portion 1371 and a seat portion 1373. The cylinder portion 1371 includes an internal thread 1372 and a step surface 1375. It is mainly in the structure of the chip package 131 and mounting of the holder 137 that the digital camera module 13 is different from the digital camera module 10.

The substrate 23 of the chip package 131 has a triple-layered structure, that is to say, the substrate 23 includes a board portion 331, a first frame portion 332, and a second frame portion 333. The first frame portion 332 is disposed on the board portion 331. The second frame portion 333 is provided on an outer periphery of an upper surface of the first frame portion 332. The board portion 331, the second frame portion 332, and a third frame portion 333 cooperatively define a receiving cavity 336 therein. The receiving cavity 336 includes a first cavity 3361 surrounded by the first frame portion 332 and includes a second cavity portion 3362 surrounded by the second frame portion 333. The first top contacts 231a are positioned on an upper surface of the board portion 331 and are exposed to the air/ambient environment. The second top contacts 231b are arranged on an inner periphery of the upper surface of the first frame portion 331 and are also exposed to the air/ambient environment.

The first chip 43 is mounted on the board portion 331, surrounded by the first top pads 231a, and received in the first cavity 3361. The first chip pads 431 are electrically connected with the first top contacts 231a via the wires 53a.

The second chip 73 is mounted on top of the first chip 43 via the adhesive/glue 63a, which is applied to the top and periphery of the first chip 43 and holds/spaces the second chip 73 above each wire loop formed by the wires 53a. Each second pad 732 is respectively electrically connected with a corresponding second top pad 231b via a corresponding wire 53b.

The cover 83 is mounted on top of second chip 73 via the adhesive/glue 63b, which is applied to the upper periphery of the second chip 73 and holds the cover 83 above each wire loop formed by the wires 53b, separating the cover 83 from the wire loops associated with the wires 53b. Moreover, the cover 83 is further adhered to the frame portion 332 via an adhesive/glue 63c, which is applied to the top of the second frame portion 322. In order to protect the wires 53b from damage of external force, at least one of the adhesive/glues 63b and 63c can be further applied to the wires 53b in a manner so as to cover the whole of each wire 53b.

The seat portion 1373 of the holder 137 is mounted to the chip package 131. The seat portion 1373 receives the cover 83 therein, and an inner surface of the step surface 1375 is adhered to the periphery of the cover 82 via the adhesive/glue 63d. Meanwhile, an end of the seat portion 1373, opposite to the step surface 1375, is adhered/attached to the upper surface of the frame portion 332 of the substrate 23 via the adhesive/glue 63e.

Figure 4:
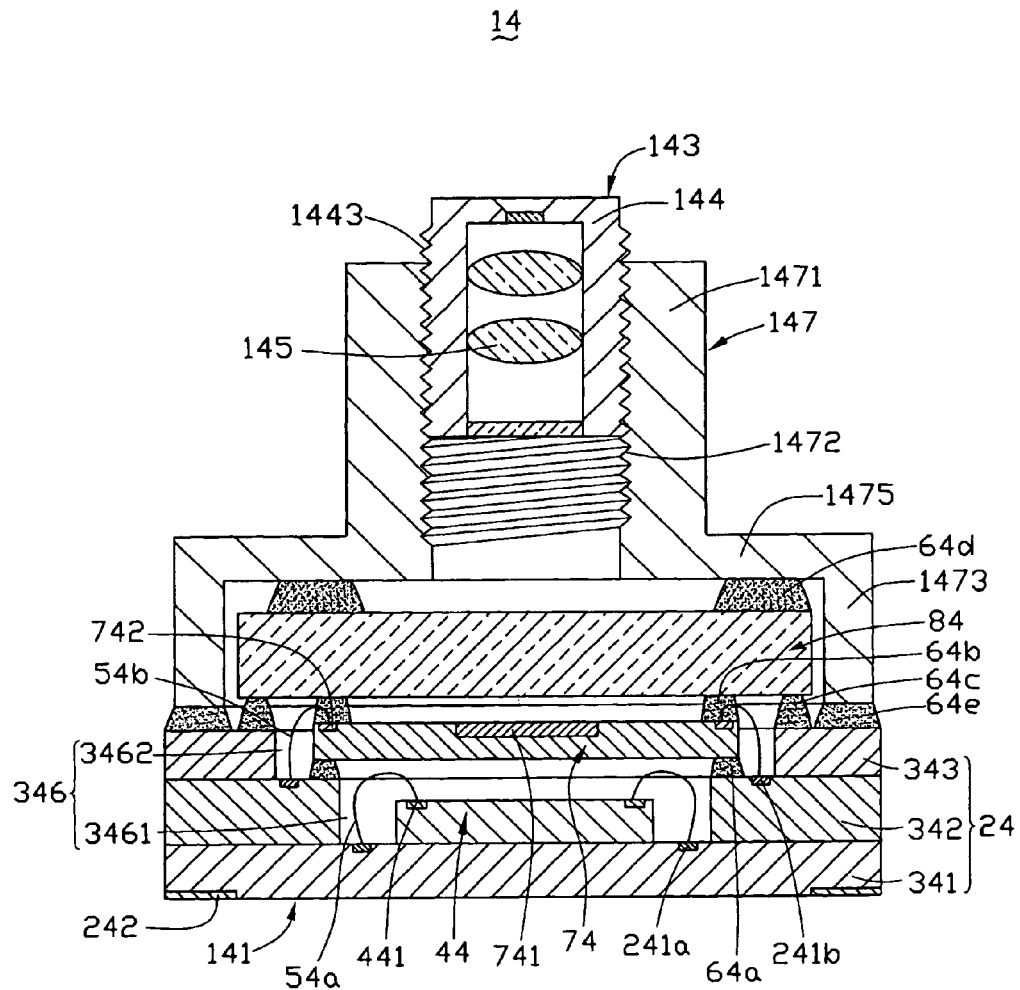
FIG. 4 is a schematic, cross-sectional view of a digital camera module, using a stacked chip package, according to a fourth preferred embodiment.

FIG. 4 shows a digital camera module 14, in accordance with a fourth preferred embodiment. The digital camera module 14 has a structure similar to that of the digital camera module 13 and includes a chip package 141; a lens module 143; and a holder 147. The stacked chip package 141 includes a substrate 24; a first chip 44; a first and second plurality of wires 54a, 54b; adhesive/glue 64a, 64b, 64c, 64d, 64e; a second chip 74; and a cover 84. The substrate 24 includes a plurality of first and second top contacts 241a, 241b, and a plurality of bottom contacts 242. The first chip 44 includes a plurality of first pads 441. The second chip 74 includes an active area 741 and a plurality of second pads 742. The lens module 143 includes a barrel 144 and at least one lens 145. The barrel 144 has an external thread 1443. The lens holder 147 includes a cylinder portion 1471 and a seat portion 1473. The cylinder portion 1471 includes an internal thread 1472 and a step surface 1475.

The digital camera module 14 is different from the digital camera module 13 in the way the second chip 74 is mounted. The second chip 74 of the chip package 141 is adhered to the first frame portion 342 via the adhesive/glue 64a, which is applied to an inner periphery of an upper surface of the first frame portion 342.

Figure 5:
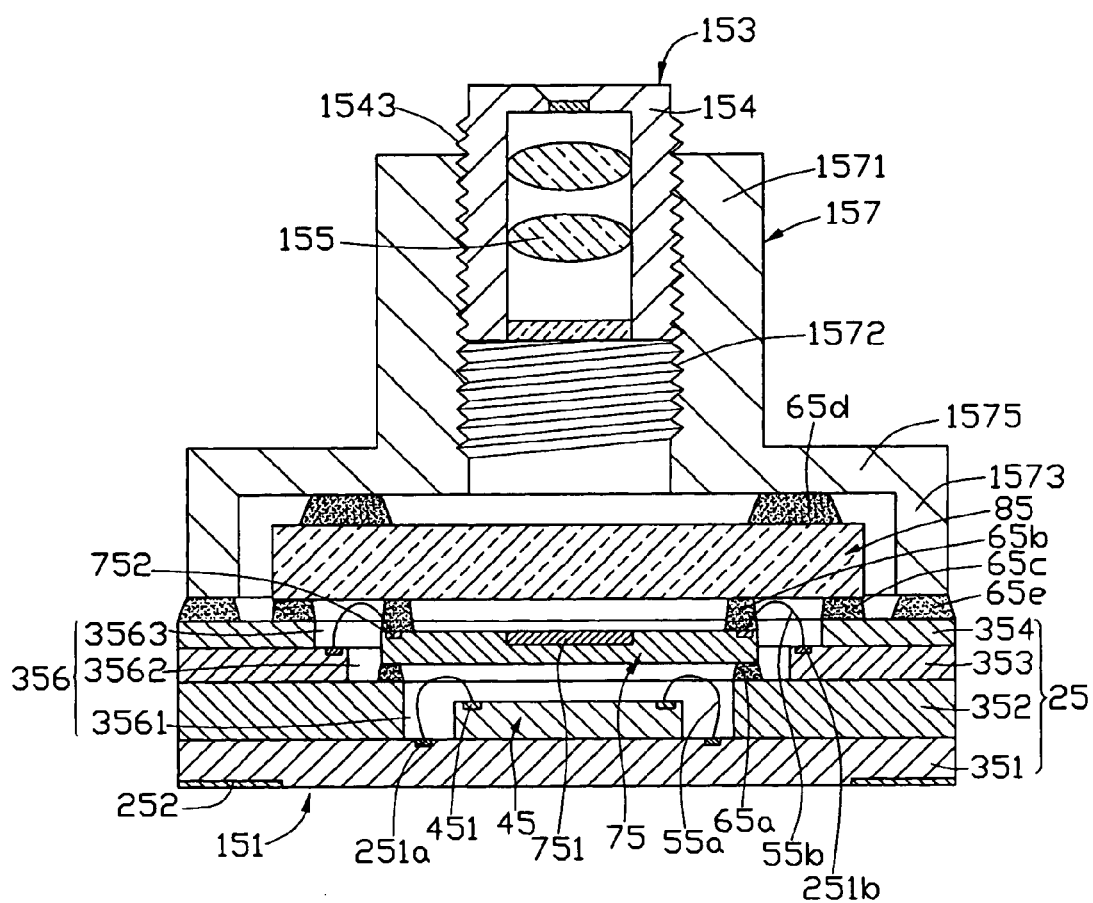
FIG. 5 is a schematic, cross-sectional view of a digital camera module, using a stacked chip package, according to a fifth preferred embodiment.

FIG. 5 shows a digital camera module 15, in accordance with a fifth preferred embodiment. The digital camera module 15 has a structure similar to that of the digital camera module 14 and includes a chip package 151; a lens module 153; and a holder 157. The stacked chip package 151 includes a substrate 25; a first chip 45; a first and second plurality of wires 55a, 55b; adhesive/glue 65a, 65b, 65c, 65d, 65e; a second chip 75; and a cover 85. The substrate 25 includes a plurality of first and second top contacts 251a, 251b, and a plurality of bottom contacts 252. The first chip 43 includes a plurality of first pads 451. The second chip 75 includes an active area 751 and a plurality of second pads 752. The lens module 153 includes a barrel 154 and at least one lens 155. The barrel 154 has an external thread 1543. The lens holder 157 includes a cylinder portion 1571 and a seat portion 1573. The cylinder portion 1571 includes an internal thread 1572 and a step surface 1575. The digital camera module 15 differs from the digital camera module 14 mainly in structure of the chip package 151.

The substrate 25 of the chip package 151 has a four-layered structure and includes a board portion 351, a first frame portion 352, a second frame portion 353, and a third frame portion 354 arranged in that order, bottom-to-top. The board portion 351 and the first, second and third frame portions 351, 352, 353 cooperatively define a receiving cavity 356 therein. The receiving cavity 356 includes a first cavity 3561 surrounded by the first frame portion 352, a second cavity 3562 surrounded by the second frame portion 353, and a third cavity 3563 surrounded by the third frame portion 354. A plurality of first top contacts 251*a* and a plurality of bottom contacts 252 are arranged on two opposite surfaces of the board portion 351, with the first top contacts 251*a* being exposed to the first cavity 3561. A plurality of second top contacts 251*b* is arranged on an upper surface of the second frame portion 353, and are exposed to the third cavity 3563.

The cover 85 of the chip package 151 is affixed to the second chip 75 via the adhesive/glue 65*b*. Moreover, the cover 85 is further adhered to the third frame portion 354 via the adhesive/glue 65*c*, which is applied to the top of the third frame portion 354.

Figure 6:
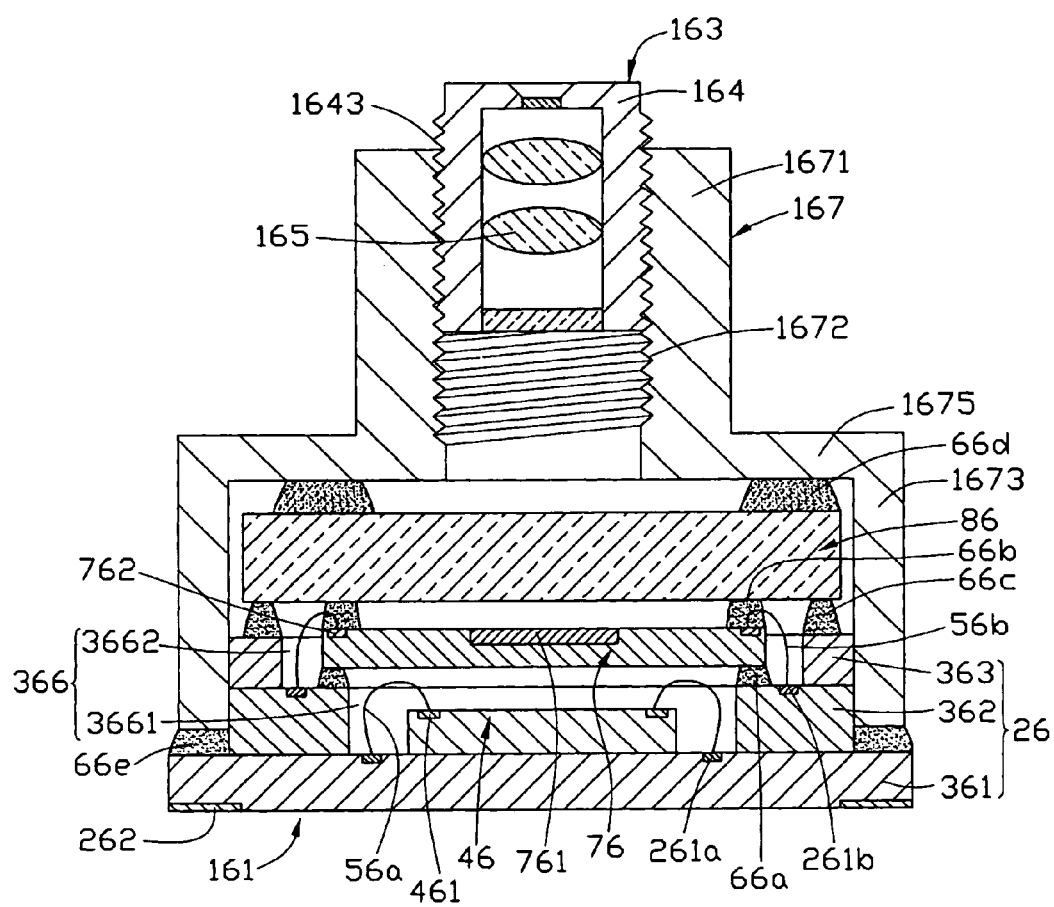
FIG. 6 is a schematic, cross-sectional view of a digital camera module, using a stacked chip package, according to a sixth preferred embodiment.
Figure 7:
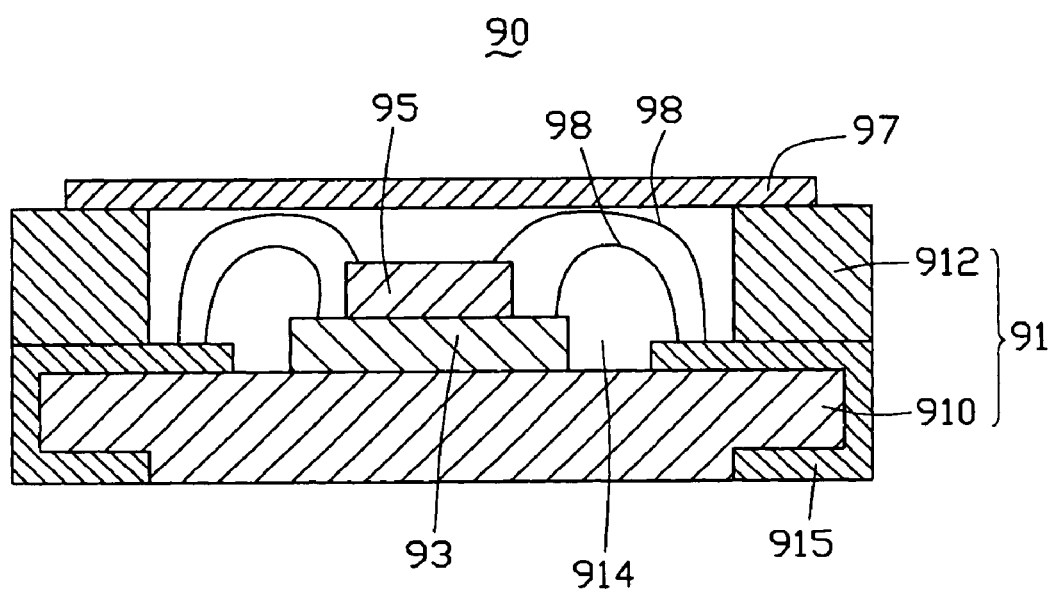
FIG. 7 is a cross-sectional view of a conventional stacked chip package.

FIG. 6 shows a digital camera module 16, in accordance with a sixth preferred embodiment. The digital camera module 16 has a structure similar to that of the digital camera module 14 and includes a chip package 161, a lens module 163, and a holder 167. The stacked chip package 161 includes a substrate 26, a first chip 46, a first and second plurality of wires 56*a*, 56*b*, adhesive/glues 66*a*, 66*b*, 66*c*, 66*d*, 66*e*, a second chip 76, and a cover 86. The substrate 26 includes a plurality of first and second top contacts 261*a*, 261*b*, and a plurality of bottom contacts 262. The first chip 46 includes a plurality of first pads 461. The second chip 76 includes an active area 761 and a plurality of second pads 762. The lens module 163 includes a barrel 164 and at least one lens 165. The barrel 164 has an external thread 1643. The lens holder 167 includes a cylinder portion 1671 and a seat portion 1673. The cylinder portion 1671 includes an internal thread 1672 and a step surface 1675.

The digital camera module 16 is different from the digital camera module 14 in structure of the substrate 26 and in the mounting of the holder 167. The board portion 361 of the substrate 16 has a size larger than that of the first and second frame portions 362 and 363. As a result of this size differential, an outer peripheral portion of the substrate 16 is not covered by the first and second frame portions 362 and 363. The seat portion 1673 of the holder 167 is mounted to the chip package 161. An inner surface of a step surface 1675 is adhered to the periphery of the cover 86 via the adhesive/glue 66*d*, and an end of the seat portion 1673, opposite to the step surface 1675, is adhered to the margin portion of the board portion 361 of the substrate 26 via the adhesive/glue 63*e*.

It is to be understood that, in the digital camera module 13, 14, 15 and 16, the first top contacts 231*a*, 241*a*, 251*a*, 261*a* can alternatively be arranged on the top of the first frame portion 332, 342, 352, 362, respectively, and the second top contacts 231*b*, 241*b*, 251*b*, 261*b* can alternatively be arranged on the top of the second frame portion 333, 343, 353, 363, respectively. It is to be understood that adhesive/glue is advantageously used in directly joining given sets of surfaces, without further intermediate layers/elements being involved, thus keeping manufacture relatively simple and cost-effective.

In addition, the lens module can be omitted so long as at least one lens is received in the cylinder portion of the holder to form a focused image on the active area of the second chip.

In the aforesaid digital camera modules, the bottom surface of the second chip is positioned above the wires connected with the first chip to the substrate. As such, the size of the second chip can thus be either larger or smaller than that of the first chip. Accordingly, chips having almost any size can be employed.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A digital camera module, comprising:
   a chip package, comprising:
   a substrate having a plurality of top contacts arranged thereon;
   a first chip attached to the substrate, the first chip including a plurality of first pads disposed on an upper surface thereof;
   a second chip disposed above the first chip, the second chip comprising a bottom surface facing the first chip and an upper surface provided with a plurality of second pads thereon;
   a plurality of wires, the wires respectively electrically connecting one of the first and second contacts to corresponding top contacts of the substrate, each wire forming a wire loop; and
   a cover disposed above the second chip, the cover having a bottom surface facing the second chip;
   wherein the bottom surface of the second chip is positioned above the wire loops of the wires connected with the first chip, and the bottom surface of the cover is above the wire loops of the wires connected with the second chip; and
   a lens module mounted to the chip package;
   wherein the lens module comprises a holder, the holder has a seat portion and a cylinder portion, the seat portion is mounted on and thereby engages the chip package, and the cylinder portion projects from the seat portion;
   wherein the cylinder portion has a diameter smaller than that of the seat portion, thereby forming a step therebetween;
   wherein the digital camera module further comprises an adhesive applied to a periphery of a surface of the cover facing the step and adhering the cover to an inner surface of the step facing the cover.

2. The digital camera module as claimed in claim 1, wherein the adhesive is also applied to the upper surface of the first chip and to a periphery of an upper surface of the second chip, wherein the adhesive applied to the first chip holds the second chip above the wire loops of the wires connected with the first chip to fix the bottom surface of the second chip on the first chip, and the adhesive applied to the second chip holds the cover above the wire loops of the wires connected with the second chip to fix the bottom surface of the cover on the second chip.

3. The digital camera module as claimed in claim 1, wherein the adhesive is further applied to the wires to cover the whole of each wire.

4. The digital camera module as claimed in claim 1, wherein the substrate comprises a board portion and a frame portion attached to the board portion, and the board portion and the frame portion cooperatively define a receiving cavity therein in which to receive the first and second chip.

5. The digital camera module as claimed in claim 4, wherein the top contacts includes a plurality of first top contacts and a plurality of second top contacts, the first top contacts are arranged on the board portion and are exposed to the cavity, the first top contacts are electrically connected with the first pads of the first chip, and the second top contacts are arranged on the frame portion and are electrically connected with the second pads of the second chip.

6. The digital camera module as claimed in claim 1, wherein the substrate comprises a board portion, a first frame portion, and a second frame portion arranged in that order, and the board portion and the first and second frame portion cooperatively define a receiving cavity therein in which to receive the first and second chip.

7. The digital camera module as claimed in claim 6, wherein the adhesive is further alternatively applied to one of the upper surface of the first chip and an inner periphery of an upper surface of the first frame portion to fix the second chip to the one thereof, and the adhesive holds the second chip above the wire loops of the wires connected with the first chip.

8. The digital camera module as claimed in claim 7, wherein the adhesive is further applied to a periphery of the second chip and holds the cover above the wire loops of the wires connected with the second chip.

9. The digital camera module as claimed in claim 8, wherein the adhesive is further applied to the wires to cover the whole of each wire.

10. The digital camera module as claimed in claim 8, wherein the adhesive is further applied to the top of the second frame portion to adhere the bottom surface of the cover thereon.

11. The digital camera module as claimed in claim 8, wherein the substrate further comprises a third frame portion, the third frame portion is attached to the second frame portion, and the adhesive is further applied to the top of the third frame portion to fix the bottom surface of the cover thereto.

12. The digital camera module as claimed in claim 6, wherein the top contacts comprise a plurality of first top contacts and a plurality of second top contacts, and the first top contacts are alternatively arranged on one of the board portion and the first frame portion and are electrically connected with the first pads of the first chip, and the second top contacts are alternatively arranged on one of the first frame portion and the second frame portion and are electrically connected with the second pads of the second chip.

13. The digital camera module as claimed in claim 1, wherein the cylinder portion of the holder receives at least one lens therein.

14. The digital camera module as claimed in claim 1, wherein the lens module further comprises a lens barrel and at least one lens disposed in the lens barrel, and the lens barrel is adjustably mounted within the cylinder portion via screw-threading.

15. The digital camera module as claimed in claim 1, wherein the seat section has an end opposite to the step, and the end of the seat section is adhered to the substrate.

16. A digital camera module, comprising:
   a chip package, comprising:
      a substrate;
      a first chip mounted on the substrate, the first chip being electrically connected with the substrate via a first plurality of wires;
      a second chip mounted above the first chip and the wires connected with the first chip, the second chip being electrically connected with the substrate via a second plurality of wires; and
      a cover mounted above the second chip and the wires connected with the second chip; and
   a lens module mounted to the chip package;
wherein the lens module comprises a holder, the holder has a seat portion and a cylinder portion, the seat portion is mounted on and thereby engages the chip package, and the cylinder portion projects from the seat portion;
wherein the cylinder portion has a diameter smaller than that of the seat portion, thereby forming a step therebetween;
wherein the digital camera module further comprises an adhesive applied to a periphery of a surface of the cover facing the step and adhering the cover to an inner surface of the step facing the cover.

\* \* \* \* \*